United States Patent
Qiu et al.

(10) Patent No.: US 8,537,529 B2
(45) Date of Patent: Sep. 17, 2013

(54) OPTICAL DISK PLAYER WITHOUT SCREWS TO POSITION THE COVER

(75) Inventors: Ji-Feng Qiu, Shenzhen (CN); Xue-Dong Tang, Shenzhen (CN); Xiao-Hui Zhou, Shenzhen (CN); Ping Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 206 days.

(21) Appl. No.: 13/244,401

(22) Filed: Sep. 24, 2011

(65) Prior Publication Data

US 2013/0003266 A1 Jan. 3, 2013

(30) Foreign Application Priority Data

Jun. 28, 2011 (CN) .......................... 2011 1 0177096

(51) Int. Cl.
 *H05K 7/00* (2006.01)
(52) U.S. Cl.
 USPC ............ 361/679.02; 361/679.07; 361/679.27

(58) Field of Classification Search
 USPC ............ 361/679.02, 679.06, 679.07, 679.27; 16/382, 383
 See application file for complete search history.

(56) References Cited

U.S. PATENT DOCUMENTS

| | | | |
|---|---|---|---|
| 6,694,570 B2 * | 2/2004 | Chen | 16/367 |
| 7,823,255 B2 * | 11/2010 | Wang et al. | 16/367 |
| 7,869,195 B1 * | 1/2011 | Patton | 361/679.01 |
| 2007/0146986 A1 * | 6/2007 | Hong et al. | 361/683 |
| 2009/0231796 A1 * | 9/2009 | Hung | 361/679.27 |
| 2012/0063112 A1 * | 3/2012 | Zhao et al. | 361/807 |

* cited by examiner

*Primary Examiner* — Anatoly Vortman
*Assistant Examiner* — Jacob Crum
(74) *Attorney, Agent, or Firm* — Altis & Wispro Law Group, Inc.

(57) ABSTRACT

An optical disk player includes a main body, a hinge, and a display. The main body includes a cover and an opposite base. The hinge includes a fixing portion coupled with the cover of the main body. The display is pivotably connecting to the main body by the hinge. The fixing portion defines a locating hole thereon. The cover defines a holding portion and a first locking portion. The first locking portion comprises a pole and a hook at an end of the pole. The holding portion of the cover is engaged in the corresponding locating hole of the fixing portion. The hook and the pole of the first locking portion clasp different sides of the fixing portion.

4 Claims, 4 Drawing Sheets

OPTICAL DISK PLAYER WITHOUT SCREWS TO POSITION THE COVER

BACKGROUND

1. Technical Field

The present disclosure relates to optical disk players.

2. Description of Related Art

Optical disk players, such as DVD (digital versatile disk) players for example, are widely used. A typical optical disk player includes a disk tray containing an optical pickup for reading the data of an optical disk and a display pivotably connected with the disk tray by a hinge. Generally, the hinge is fixed on the disk tray with screws; therefore, the common optical disk player is costly and time-consuming to assemble.

What is needed, therefore, is an optical disk player which can ameliorate the problem described above.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Embodiments of the present disclosure will now be described in detail below, with reference to the accompanying drawings.

Figure 1:
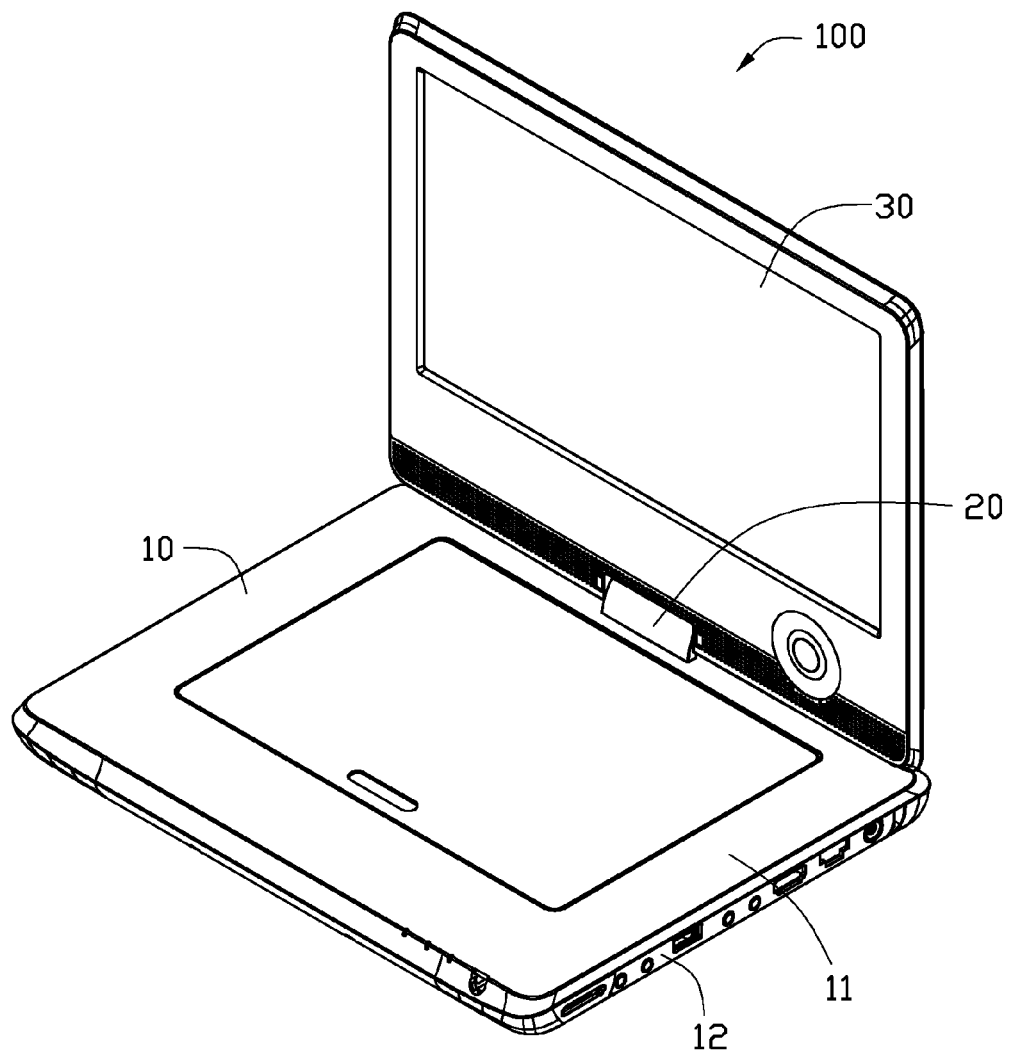
FIG. 1 is a schematic, isometric view of an optical disk player comprising a disk tray and a display connected with the disk tray by a hinge according to an exemplary embodiment.
Figure 2:
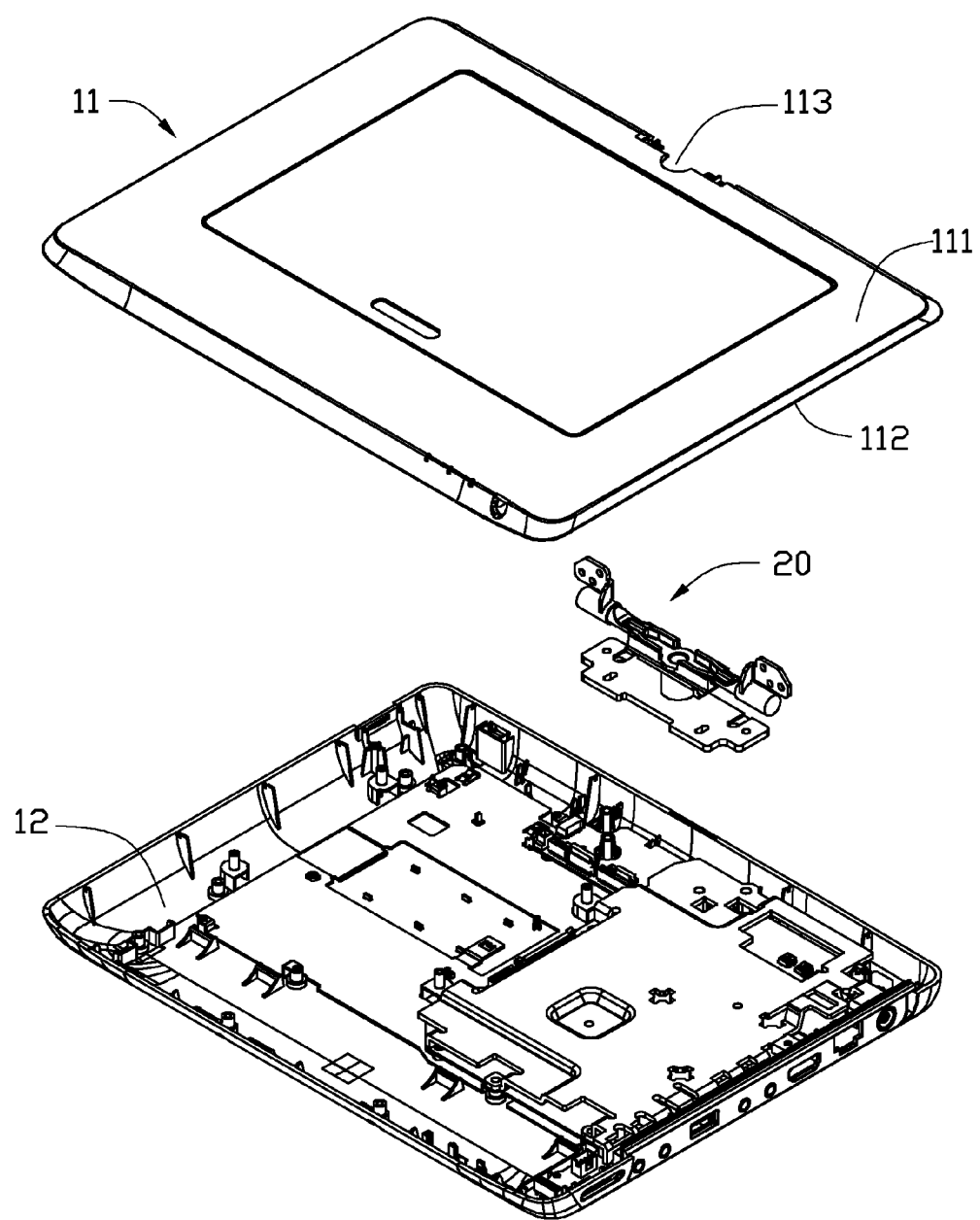
FIG. 2 is a disassembled, schematic view of the disk tray and the hinge in FIG. 1.

Referring to FIGS. 1 and 2, an optical disk player 100 according to an exemplary embodiment is shown. The optical disk player 100 includes a main body 10, a hinge 20, and a display 30. The display 30 is pivotably connecting to the main body 10 by the hinge 20, and can rotate relative to the main body 10. The optical disk player 100 can be a DVD player, a CD (compact disk) player, or a VCD (video compact disk) player, for example. In the present embodiment, the optical disk player 100 is a DVD player.

Figure 3:
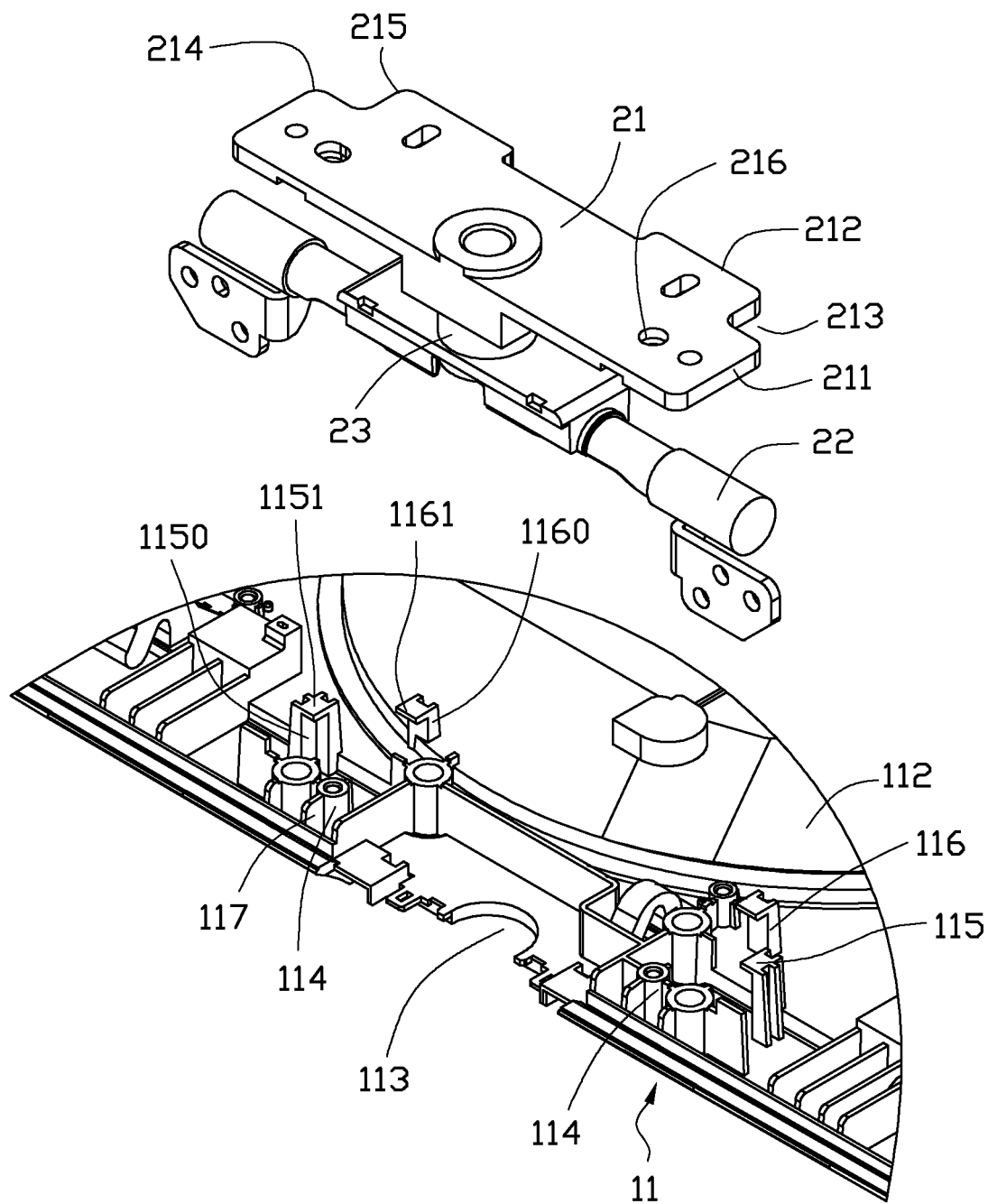
FIG. 3 is a partially enlarged reverse view of the disk tray and the hinge in FIG. 2.
Figure 4:
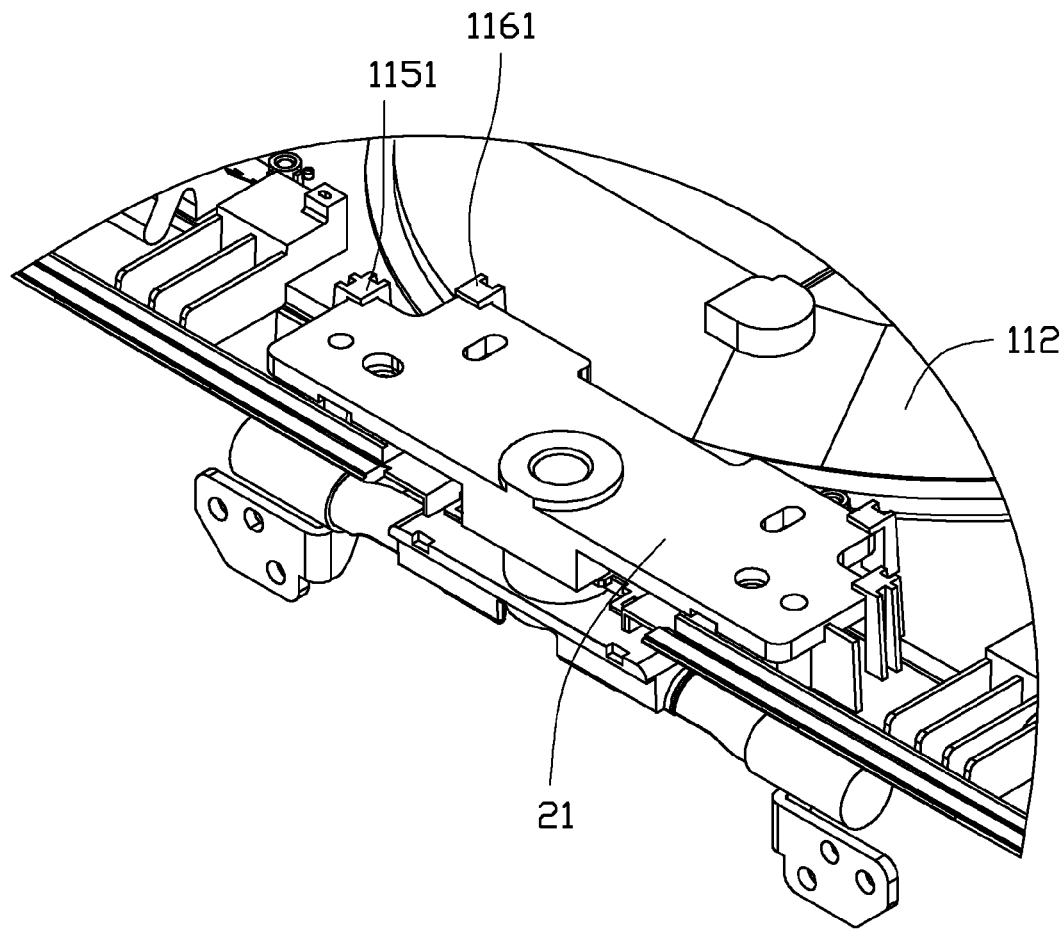
FIG. 4 is an assembled, schematic view of the disk tray and the hinge in FIG. 3.

Referring to FIGS. 3 and 4, the main body 10 includes a cover 11 and a base 12 opposite to the cover 11. The cover 11 and the base 12 are combined to make a space for receiving some electrical components, such as a circuit board.

The cover 11 includes a top surface 111 and an opposite bottom surface 112, and defines an opening 113 at one edge thereof corresponding to the hinge 20. The bottom surface 112 of the cover 11 has two symmetrical holding portions 114, two symmetrical first locking portions 115 and two symmetrical second locking portions 116 extending downwards therefrom towards the base 12. The holding portions 114, the first locking portions 115 and the second locking portions 116 are positioned adjacent to the opening 113.

The holding portions 114 are arranged symmetrical to the opening 113. Each of the holding portions 114 is cylindrical-shaped. A cross section of the holding portion 114 can be circular, or rectangular-shaped, for example. In the present embodiment, cross sections of the holding portions 114 are substantially circular. A plurality of reinforcing ribs 117 extends radially from an outer surface of each holding portion 114, and one of the reinforcing ribs 117 connects the edge of the cover 11 defining the opening 113. The reinforcing rib 117 is slightly lower than that of the holding portion 114.

The first locking portions 115 and the second locking portions 116 each is a pole with a hook formed at a top end. The numbers of the first, second locking portions 115, 116 can be limited according to a simulated calculation in advance.

The hinge 20 is placed on the edge of the cover 11 with the opening 113 thereon, and includes a fixing portion 21, an axial rod 22 and a middle axial pole 23 sandwiched between the fixing portion 21 and the axial rod 22. The fixing portion 21 is fixed onto the cover 11, the axial rod 22 extends through the opening 113 of the cover 11, and the middle axial pole 23 engages with the display 30, thereby rotatably mounting the display 30 on the main body 10. Additionally, an extending direction of the axial rod 22 is perpendicular to that of the middle axial pole 23. The middle axial pole 23 is located between and perpendicular to the fixing portion 21 and the axial rod 22.

The fixing portion 21 is a generally rectangular-shaped plate, which has opposite first sides 211 and second sides 212. A length of the first side 211 is less than that of the second side 212. A length of the fixing portion 21, i.e., the length of the second side 212 is substantially the same as a distance between the first locking portions 114. A width of the fixing portion 21, i.e., the length of the first side 211 is substantially the same as a distance between the second locking portions 116 and the edge of the cover 11. The fixing portion 21 has two recesses 213 located at opposite ends of one of the second sides 212 away from the edge of the cover 12, so two first corners 214 are respectively formed at the opposite first sides 211 and two second corners 215 are respectively formed at a common second side 212. The fixing portion 21 defines two symmetrical locating holes 216 respectively adjacent to the opposite first sides 211. The configuration for the locating holes 216 are respectively corresponding to the profiles of the holding portions 114. In the present embodiment, the locating hole 216 is circular, and an inner diameter of the locating holes 216 is mainly equal to an outer diameter of the holding portion 114.

In assembly of the optical disk player 100, the fixing portion 21 of the hinge 20 is horizontally placed into the cover 11 of the main body 10 first. In one embodiment, the second side 212 of the fixing portion 21 is aligned with the edge of the cover 11 with the opening 113 defined thereon, and then the middle axial pole 23 is placed into the opening 113 of the cover 11 by the hinge 20. Resulting in the first corner 214 received in the first recess 1150 to contact the top plate 1151 of the first locking portion 115 and the second corner 215 received in the second recess 1160 to contact the top plate 1161 of the second locking portion 116. Such that a vertical offset for the fixing portion 21 can be confined. Simultaneously, the holding portion 114 of the cover 11 is introduced into a corresponding locating hole 216 of the fixing portion 21, and the reinforcing rib 117 of the holding portion 114 is attached to bottom of the fixing portion 21, such that a horizontal offset for the fixing portion 21 can be confined. The cover 11 is coupled to the base 12, the axial rod 22, and the middle axial pole 23 of the hinge 20 extending out of the opening 113 of the cover 11, and then the display 30 is pivotably connected to the axial rod 22 of the hinge 20. Thereby, the fixing portion 21 can be firmly fixed on the cover 11 of the main body 10, there is no need to use screws to position the fixing portion 21 and the cover 11, the optical disc is cheap and assembly saves time.

While certain embodiments have been described and exemplified above, various other embodiments will be apparent to those skilled in the art from the foregoing disclosure. The disclosure is not limited to be particular embodiments described and exemplified, and the embodiments are capable of considerable variation and modification without departure from the scope and spirit of the appended claims.

What is claimed is:

1. An optical disk player comprising:
a main body comprising a cover and an opposite base;
a hinge comprising a fixing portion coupled with the cover of the main body; and
a display being pivotably connecting to the main body by the hinge,
wherein the fixing portion defines at least one locating hole thereon, the cover defining at least one holding portion and at least one first locking portion, the at least one first locking portion comprising a pole and a hook at an end of the pole, the holding portion of the cover being engaged in the corresponding locating hole of the fixing portion, the hook and the pole of the first locking portion clasping different sides of the fixing portion, the at least one holding portion defines a plurality of reinforcing ribs extending radially from an outer surface of each of the at least one of holding portion, and the reinforcing rib is slightly lower than the at least one holding portion.

2. The optical disk player as claimed in claim 1, wherein the hinge further comprises an axial rod and a middle axial pole sandwiched between the fixing portion and the axial rod, an extending direction of the axial rod is perpendicular to that of the middle axial pole, the middle axial pole is engaged with the display.

3. The optical disk player as claimed in claim 2, wherein the cover defines an opening at one edge thereof corresponding to the hinge, the middle axial rod extends through the opening of the cover.

4. The optical disk player as claimed in claim 1, wherein the cover further defines at least one second locking portion adjacent to the at least one first locking portion, the at least one second locking portion comprises a second pole and a second hook at an end of the pole, the hook and the pole of the first locking portion with the second pole and the second hook of the second locking portion cooperatively clasping different sides of the fixing portion.

* * * * *